United States Patent
Kumar

(10) Patent No.: US 6,949,456 B2
(45) Date of Patent: Sep. 27, 2005

(54) METHOD FOR MANUFACTURING SEMICONDUCTOR DEVICE HAVING POROUS STRUCTURE WITH AIR-GAPS

(75) Inventor: Devendra Kumar, Los Altos, CA (US)

(73) Assignee: ASM Japan K.K., Tokyo (JP)

( * ) Notice: Subject to any disclaimer, the term of this patent is extended or adjusted under 35 U.S.C. 154(b) by 71 days.

(21) Appl. No.: 10/693,200

(22) Filed: Oct. 24, 2003

(65) Prior Publication Data

US 2004/0087133 A1 May 6, 2004

Related U.S. Application Data

(60) Provisional application No. 60/422,956, filed on Oct. 31, 2002.

(51) Int. Cl.$^7$ .......................................... H01L 21/4763
(52) U.S. Cl. ....................... 438/619; 438/623; 257/522; 257/762; 257/759
(58) Field of Search .................................. 438/618, 619, 438/638, 622, 919, 411

(56) References Cited

U.S. PATENT DOCUMENTS

| | | | | |
|---|---|---|---|---|
| 5,798,559 A | * | 8/1998 | Bothra et al. ............... | 257/522 |
| 6,255,712 B1 | * | 7/2001 | Clevenger et al. .......... | 257/522 |
| 6,440,838 B1 | * | 8/2002 | Lui et al. .................... | 438/618 |
| 6,440,861 B1 | * | 8/2002 | Liu et al. .................... | 438/706 |
| 6,780,753 B2 | * | 8/2004 | Latchford et al. .......... | 438/619 |
| 6,815,329 B2 | * | 11/2004 | Babich et al. .............. | 438/619 |
| 6,841,844 B2 | * | 1/2005 | Hsu et al. .................... | 257/522 |
| 2002/0028575 A1 | * | 3/2002 | Besling et al. ............. | 438/638 |
| 2002/0098677 A1 | * | 7/2002 | Ahn et al. ................... | 438/622 |
| 2003/0064577 A1 | * | 4/2003 | Hsu et al. .................... | 438/619 |
| 2004/0063305 A1 | * | 4/2004 | Kloster et al. ............. | 438/619 |
| 2005/0037604 A1 | * | 2/2005 | Babich et al. .............. | 438/619 |

* cited by examiner

*Primary Examiner*—Olik Chaudhuri
*Assistant Examiner*—Belur Keshavan
(74) *Attorney, Agent, or Firm*—Knobbe Martens Olson & Bear, LLP

(57) ABSTRACT

A method for manufacturing a semiconductor device includes: (i) depositing a sacrificial layer made of an organic polymer such as benzocyclobutene on a substrate having a circuit formed thereon; (ii) etching the sacrificial layer except for a portion where air gaps are to be formed; (iii) depositing a low-dielectric layer over the substrate until the portion for air gaps is entirely enclosed in the low-dielectric layer; (iv) etching the low-dielectric layer to form via holes and trenches there through; (v) prior or subsequent to step (iv), removing the portion for air gaps; and (vi) depositing copper in the vias and trenches which are filled with the copper contacting a surface of the substrate.

21 Claims, 6 Drawing Sheets

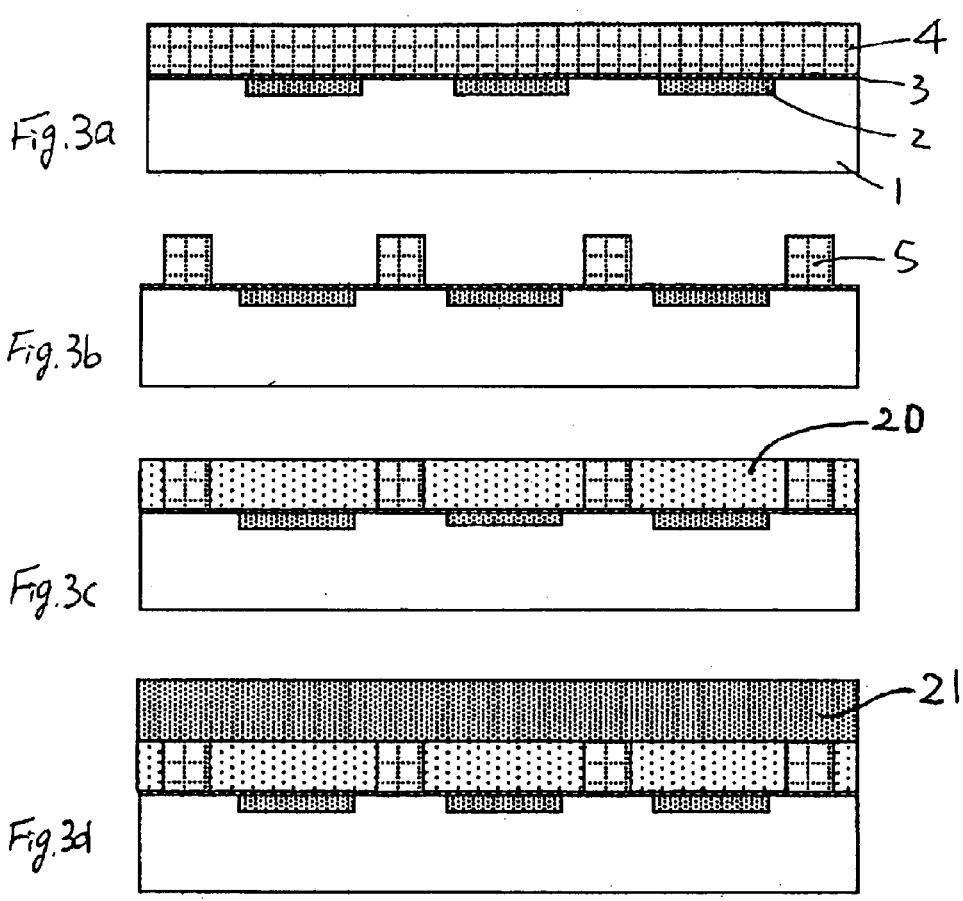

METHOD FOR MANUFACTURING SEMICONDUCTOR DEVICE HAVING POROUS STRUCTURE WITH AIR-GAPS

This Application Non-Provisional of 60/422,956 Oct. 31, 2002 Pending.

BACKGROUND OF THE INVENTION

1. Field of the Invention

This invention relates to methods of manufacturing semiconductor devices having a porous structure and voids (air-gaps), and particularly relates to methods that involve selectively etching a sacrificial film.

2. Description of the Related Art

In recent years, semiconductor devices have become faster and more highly integrated and resistance-capacitance (RC) coupling delays have become a large factor in signal processing time. RC delays can be decreased by reducing wiring capacitance. One way to do this is to use low dielectric constant materials such as fluorine-doped $SiO_2$, porous $SiO_2$, an organic film or a porous film, etc. However, these materials have not been put to practical use because of problems such as processing difficulty and insufficient heat-resistance, which can increase the complexity of the integration processes and lower device reliability. Although, fluorinated silicon glass (FSG) is in production for 130 nm node technology, but for 90 nm and smaller nodes, low-k dielectrics with $k \leq 3$ are desired for manufacturing future semiconductor devices.

It is projected that high volume manufacturing of faster logic and other devices with 45 nm or lower nodes interconnect structures will require extreme low-k, such as $k \leq 2.4$.

The low-k interlayer dielectrics (ILDs) for 65 nm or lower nodes require not only low k values but also superior mechanical properties, thermal stability, and applicability to integration processes with copper for Dual Damascene structures. These integration processes are disclosed in U.S. Pat. No. 6,440,838 and U.S. Pat. No. 6,440,861, for example. Further, it is preferable to adapt currently available materials, tools, and apparatuses to high volume manufacturing.

SUMMARY OF THE INVENTION

One approach to meet the above requirements is to create porosity in dielectric films deposited by SOD (spin-on-dielectrics) or CVD techniques. For SOD materials, the starting materials may be oxide based silica materials or organic polymers. A sacrificial porogen material is used along with the main ILD material during film deposition steps. Using thermal or other techniques, the sacrificial material can be removed. However, this approach has disadvantages: The deposited dielectric layer has a very high porosity (e.g., >30%) with bimodal or trimodal pores with pore sizes ranging from 2 nm to 9 nm or higher. Thus, mechanical properties of the layer are very low, particularly hardness and cohesive strength. Also, because of large pores, new and costly processes may be required for the Dual Damascene integration with copper. This processes may result in poor yields and also pose very high challenge for successful integration with copper. For CVD deposited ILDs, one of the starting dielectric material could be oxygen-doped silicon glass (OSG), such as Aurora™ low-k film (ASM Japan, Tokyo), that has a dielectric constant of 3.05 or less, and use of a suitable porogen/sacrificial material which is to be removed is required.

An alternative approach to manufacture extreme low-k dielectric films with $k \leq 2.4$ is to provide air gaps in the dielectric films themselves. The present invention relates to ELK (extreme low-k) dielectric films with air gaps generated during integration steps. The present invention can be adapted to SiCO-based films by plasma CVD such as PECVD (plasma enhanced CVD) including RPCVD (remote plasma CVD) or thermal CVD, or by sputtering or SOG (Spin on Glass).

In an aspect, an embodiment of the present invention provides a method for manufacturing a semiconductor device, comprising the steps of: (i) depositing a sacrificial layer on a substrate having a circuit formed thereon; (ii) etching the sacrificial layer except for a portion where air gaps are to be formed; (iii) depositing a low-dielectric layer over the substrate until the portion for air gaps is entirely enclosed in the low-dielectric layer; (iv) etching the low-dielectric layer to form via holes ("vias") and trenches therethrough; (v) prior or subsequent to step (iv), removing the portion for air gaps of the sacrificial layer; and (vi) depositing copper in the vias and trenches which are filled with the copper contacting a surface of the substrate. By the above method, an ELK film having excellent mechanical properties and excellent applicability to the Dual Damascene process can effectively and easily be obtained. In the above, an etch stop layer can be used before depositing a low-k film. The purpose of the etch stop layer may have two folds; as a mechanical support and as a reference etch stop layer for stopping etch.

The present invention includes various embodiments. For example, the present invention includes, but are not limited to, the following embodiments:

In the above, step (iii) may comprise: (iiia) depositing a first low-dielectric layer over the substrate until the first low-dielectric layer and the portion for air gaps are of equal height; and (iiib) depositing a second low-dielectric layer on the first low-dielectric layer and the portion for air gaps.

The substrate may further include a cap layer on which the sacrificial layer deposits, wherein step (ii) further includes etching the cap layer. Further, the substrate may further includes a wiring layer underneath the cap layer, wherein the wiring layer is connected to the copper.

The sacrificial layer may be made of an organic polymer, such as benzocyclobutene (BCB). When using an organic polymer, step (v) may be selective etching (or selective thermal removal) based on etching temperature (e.g., BCB's decomposition temperature is below 400° C.). For example, the etching temperature is 400° C. or lower, depending on the type of sacrificial layer and the type of dielectric layer.

When using multiple low-dielectric layers, the first low-dielectric layer may have a dielectric constant of 3.5 or less, preferably 3.0 or less, further preferably 2.5 or less, and the last low-dielectric layer may have a dielectric constant of 4.0 or less, preferably 3.0 or less, further preferably 2.7 or less. Such a low-dielectric layer is useful especially for 45 nm node device manufacturing. These layers are porous, and for example, Aurora™ 2.7 low-k film (ASM Japan) may have a dielectric constant of approximately 3.05–2.7 and a porosity of approximately 6–7%, and Aurora™ 2.6–2.4 film (ASM Japan) may have a dielectric constant of approximately 2.6–2.4 and a porosity of approximately 15–16%. In other embodiments, Aurora™ low-k film with k 3.05–2.7 and Aurora™ ULK films with k 2.6–2.4 are compressive films deposited preferably by CVD methods. The Aurora™ ULK films are deposited by a combination of suitable precursor such as DMDMOS with DVDMS or any other oxygen containing molecules, such as, oxygen, $H_2O_2$, THF, cyclic or linear alcohols, acids, ethers, and lactones.

The air gaps in the low-dielectric layer may be formed between adjacent vias to reduce the dielectric constant from a range of e.g., 2.4–2.9 without air-gaps (including 2.5, 2.6, 2.7, and 2.8) to e.g., 1.7–2.4 with air gaps (including 1.8, 1.9, 2.0, 2.1, 2.2, and 2.3). The vias and the air gaps may be substantially of equal height. The height of the portion for air gaps may be in the range of 1 nm to 50 nm.

The above method may be conducted using a plasma CVD chamber.

In another aspect, an embodiment of the present invention provides a semiconductor device having a porous structure comprising: (a) a substrate on which a wiring layer is formed; (b) a low-dielectric layer having a porosity of 5% to 30% (preferably 10–20%) and further having voids or air-gaps, said low-dielectric layer having vias and trenches formed therethrough; (c) a contact layer of copper with which the vias and trenches are filled, said contact layer is in contact with the wiring layer and an upper surface of the contact layer is exposed from the dielectric layer. The air-gaps are simply voids and may be filled with air, although the type of fluid present in the air-gaps is not limited and may depend on the surrounding environment.

This aspect of the present invention includes, but are not limited to, the following embodiments:

The low-dielectric layer and the contact layer may be laminated multiple times.

The low-dielectric layer may include air gaps wherein the vias and the air gaps may be substantially of equal height. The material of the low-dielectric layer may have a dielectric constant of 2.95 or less.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

DETAILED DESCRIPTION OF THE PREFERRED EMBODIMENT

Figure 1A:
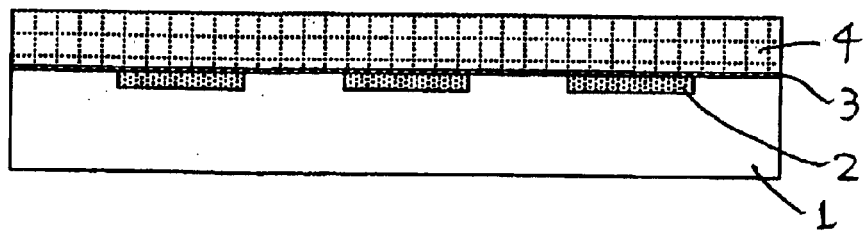
FIG. 1 (*a*) to (*f*) are cross sections of an embodiment illustrating a method for producing a porous structure with air-gaps in a semiconductor device.

As described above, in an aspect, the present invention provides a method for manufacturing a semiconductor device, which method can be performed using any suitable plasma CVD chambers which can be operated as one operation system. This is an advantage of the present invention. However, chambers specifically designed for respective steps can be used. The method is suitable for any Damascene process, especially the Dual Damascene process which is described in U.S. Pat. No. 6,440,838 or U.S. Pat. No. 6,440,861, for example, the disclosure of which is incorporated herein by reference in its entirety.

An embodiment comprises the steps of: (i) depositing a sacrificial layer on a substrate having a circuit formed thereon; (ii) etching the sacrificial layer except for a portion where air gaps are to be formed; (Add the comment written above for etch stop layer option) (iii) depositing a low-dielectric layer over the substrate until the portion for air gaps is entirely enclosed in the low-dielectric layer; (iv) etching the low-dielectric layer to form vias and trenches therethrough; (v) prior or subsequent to step (iv), removing the portion for air gaps of the sacrificial layer; and (vi) depositing copper in the vias and trenches which are filled with the copper contacting a surface of the substrate. The purpose of the etch stop layer may have two folds; as a mechanical support and as a reference etch stop layer for stopping etch.

Step (iii) may comprise multiple steps to form multiple low-k layers. For example, step (iii) includes: (iiia) depositing a first low-dielectric layer over the substrate until the first low-dielectric layer and the portion for air gaps are of equal height; and (iiib) depositing a second low-dielectric layer on the first low-dielectric layer and the portion for air gaps. The number of layers may not be limited to two and can be more than two including 3, 4, and 5.

An etch stop layer can be formed between the first low-dielectric layer and the second low-dielectric layer.

When using multiple low-dielectric layers, the first low-dielectric layer may have a dielectric constant of 2.75 or less (including a range of 2.4 to 2.9), and the last low-dielectric layer may have a dielectric constant of 4 or less (including a range of 2.4 to 4). The low-dielectric layer may be made of non-doped silicon glass (NSG), phosphate-doped silicon glass (PSG), boron phosphate-doped silicon glass (BPSG), fluorine-doped silicon glass (FSG), silicon-containing carbon compounds, OSG or CDO, organo silicon, or siloxan polymer, etc. Siloxan polymers can effectively be used as disclosed in U.S. Pat. No. 6,455,445 issued Sep. 24, 2002, U.S. Pat. No. 6,352,945 issued Mar. 5, 2002, U.S. Pat. No. 6,383,955 issued May 7, 2002, U.S. Pat. No. 6,410,463 issued Jun. 25, 2002, and U.S. Pat. No. 6,432,846 issued Aug. 13, 2002, disclose material gases which are also usable in the present invention. The disclosure of each U.S. patent application is herein incorporated by reference in its entirety.

In the above, the dielectric constant is measured prior to the formation of air gaps; i.e., the dielectric constant of the material itself in the form of a film formed on a substrate.

The low-dielectric layer can be composed of a single layer which may be made of any of the foregoing. The thickness of the dielectric layer(s) in total may be in the range of 1 nm to 1000 nm (preferably 1 nm to 500 nm). When using two layers, the first layer may have a thickness of 1 nm to 10 nm, whereas the second layer may have a thickness of 1 nm to 300 nm.

The low-dielectric layer including air-gaps or voids may have a dielectric constant of 2.4 or less, preferably 2.2 or less (including a range of 1.7 to 2.5).

The sacrificial layer may be made of any suitable material having property allowing selective etching. That is, the sacrificial layer is selectively etched while the low-dielectric layer and other non-sacrificial layers are substantially not etched. Preferably, the material is CVD deposited so that semiconductor devices can be manufactured using a single operation system which may comprise multiple process chambers. In an embodiment where PECVD is used, the material may be hydrocarbon or an organic polymer such as benzocyclobutene (BCB), aromatic or aliphatic hydrocarbons with or without any oxygen or nitrogen attached thereto. The formation of the sacrificial layer may also be conducted based on the foregoing U.S. patents. In another embodiment where a spin-on method is used, BCB, polyadamentane, polyhydrocarbons, polyethers, polylactones, and the like can be used.

When using an organic polymer, step (v) may be selective etching based on etching temperature at which the sacrificial layer material is selectively decomposed thermally. For example, the etching temperature (i.e., the material's thermal decomposition temperature) is 400° C. or lower (including a range of 150° C. to 425° C.), depending on a combination of the type of sacrificial layer and the type of dielectric layer. For example, a hydrocarbon polymer such as BCB is decomposed at a temperature of 400° C. or lower because the compound has alkylene linkages which are very prone to thermal decomposition at a temperature of approximately 375° C. When the sacrificial layer material is decomposed, it may become in gaseous form at the decomposition temperature, so that the material can penetrate through the porous dielectric layer, accomplishing removal of the sacrificial material.

The material of the sacrificial layer may be subjected to selective thermal treatment and other etching treatment with an etching gas such as fluorine-containing hydrocarbon, oxidatve and nitrogen containing hydrocarbon at a pressure of 100 to 1000 Pa, for example. The thickness of the sacrificial layer may be in the range of 1 nm to 1000 nm (preferably 1 nm to 100 nm).

In an embodiment, after the sacrificial layer is deposited, the layer is subjected to etching except for a portion for forming air gaps or voids in the low-dielectric layer. This etching can be achieved by current Aurora™ low-k film established chemistries, such as, combinations of $Ar/O_2/CF_4/CH_2F_2$ for $SiO_2$ and SiC, $Ar/O_2/C_4F_8/N_2/CH_2F_2$ for Aurora™ trenches and vias, $Ar/O_2/CF_4/CH_2CF_2$ for barrier dielectric layers, for example. The dielectric layer has a porosity of 5–30% (including a range of 10% to 20%) so that the sacrificial layer material in gaseous form can easily be removed through the pores without an opening purposely formed in an etch stop layer or cap film layer. If the porosity is too high, the mechanical strength may suffer. The portion for air-gaps is formed in a pattern. The pattern is composed of aligned small pieces (projections) to form an air-gap structure in the low-dielectric layer. The shape of each projection for an air gap or a void may vary, and the cross-section may be a circle, oval, triangle, rectangle, or the like. The height and width of each projection may be 0.5 nm to 500 nm (including a range of 1 nm to 200 nm) and 0.5 nm to 1000 nm (including a range of 0.5 nm to 500 nm), respectively. The pattern is configured to position the projections so that vias can be formed between the projections. The vias to be formed and the air gaps may be substantially of equal height. In an embodiment, the distribution of air-gaps is such that the dielectric constant of the dielectric layer is reduced from a range of 2.4–2.9 to a range of 1.7–2.4, for example, or reduced by 0.4–0.7. In an embodiment, the dielectric constant of the dielectric layer may be as high as 3.0–3.5 and reduced to 2.5–3.0, for example.

The substrate may further include a cap layer on which the sacrificial layer deposits, wherein step (ii) described above further includes etching the cap layer. Further, the substrate may further includes a wiring layer underneath the cap layer, wherein the wiring layer is connected to the copper. These layers can be formed by any suitable methods.

In an embodiment, the cap layer may be either of polysilicon (polycrystal silicon), amorphous silicon, SiN, SiON, SiO, an organic film or a porous film, which has a thickness of 1 nm to 100 nm.

In an embodiment, a method of manufacturing a semiconductor device comprises forming an interlayer insulator in the form of a porous structure with air-gaps.

In another aspect, an embodiment of the present invention provides a semiconductor device having a porous structure comprising: (a) a substrate on which a wiring layer is formed; (b) a low-dielectric layer having a porosity of 5% to 30% (including 6–25%) and having air-gaps or voids, said low-dielectric layer having vias and trenches formed therethrough; (c) a contact layer of copper with which the vias and trenches are filled, said contact layer is in contact with the wiring layer and an upper surface of the contact layer is exposed from the dielectric layer.

The present invention will be explained below with reference to drawings. The present invention includes various embodiments and should not be limited to the following embodiments.

Embodiments are illustrated in FIGS. 1–3. FIG. 1(a) to (f) are cross sections illustrating a method for forming a porous structure with air-gaps in a semiconductor device. In FIG. 1(a), a wiring layer 2 is formed on a semiconductor substrate 1 (made of copper, for example) The wiring layer 2 can be formed by ECD/ECMD copper deposition using existing tool and process technology followed by CMP using existing tools and process technologies. The wiring layer 2 can also be formed by MOCVD copper deposition, followed by CMP polishing.

On top of the wiring layer 2 and the substrate 1, a cap film layer 3 (made of SiC, SiN, SiCN, SiCO, for example) is formed by PECVD or SOD deposition using existing tools and process technology at a thickness of 5 nm to 100 nm. A sacrificial layer 4 (made of BCB, for example) can then be formed thereon by PECVD or SOD using any suitable methods including existing tools and process technology.

Figure 1B:
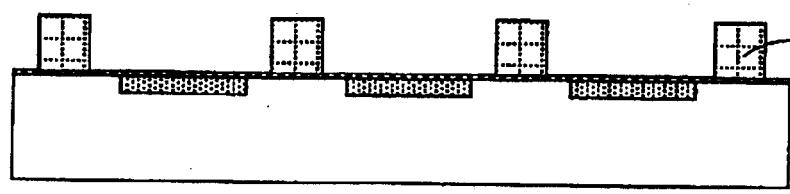

In FIG. 1(b), after placing a mask (not shown), the sacrificial layer 4 is patterned and etched except for portions (projections) where air gaps are to be formed. The projection is cylindrical and has a height of 1 nm to 200 nm, a diameter of 25 nm to 65 nm, and the distance between the adjacent projections is 50 nm to 500 nm. This process can be conducted by plasma etching. As a result, only the portions 5 for air gaps are left on the cap film layer 3. The height of the portions 5 is to be equal to the height of via holes 8.

Figure 1C:
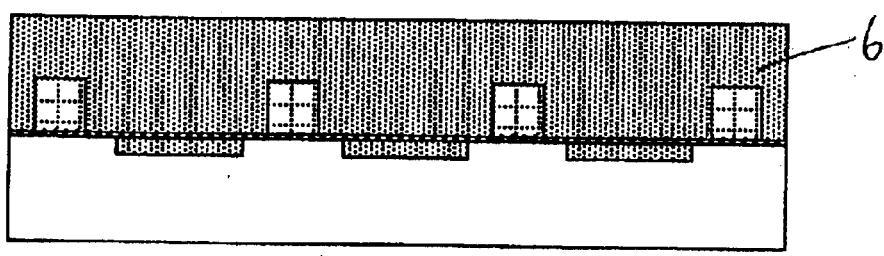

In FIG. 1(c), a low-dielectric layer 6 (made of SiCO or FSG or oxide films, for example) is formed so that the projections 5 are entirely covered with the low-dielectric layer 6 and further a layer where trenches 7 are to be formed is formed. The low-dielectric layer 6 may have a dielectric constant of 2.4 to 4, hardness of 1 GPa to 6 GPa, modulus of 4 GPa to 30 GPa, and stress is preferably compressive. After forming the low-dielectric layer 6, the top of the layer is polished or etched to level the top surface. The low-dielectric layer is required to be stable as compared with the sacrificial layer with respect to, e.g., resistance against an etching fluid and/or thermal resistance so that the sacrificial layer can effectively be removed without the occurrence of unwanted etching to the low-dielectric layer.

Figure 1D:
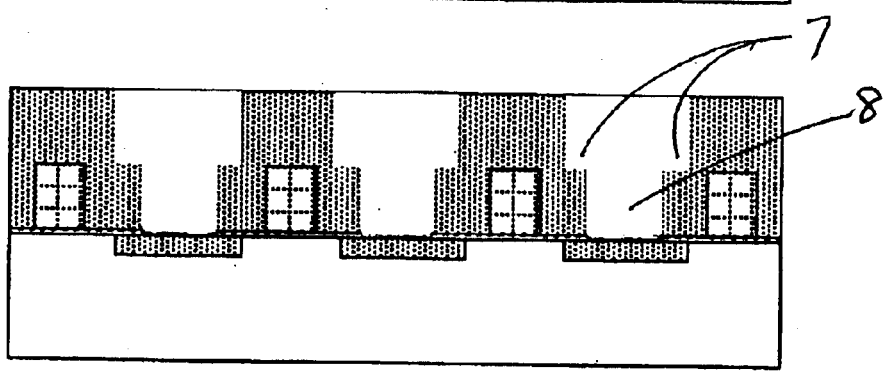

In FIG. 1(d), via holes 8 and trenches 7 are formed in the low-dielectric layer 6. The holes can be formed by plasma etching. The trenches can be formed by plasma etching.

Figure 1E:
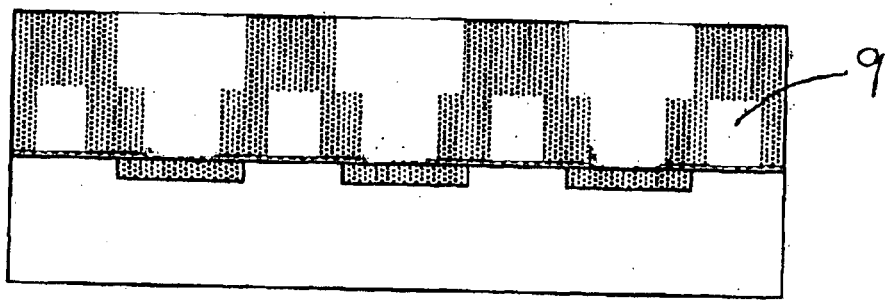

In FIG. 1(e), the projections 5 are etched and removed to form air gaps or voids 9 by thermal treatment at 150° C. to 425° C. The low-dielectric layer 6 has mechanical and thermal stability so that only the projections 5 can be selectively etched. The projections 5 are decomposed at a temperature of 150° C. to 425° C., for example, and using an etching gas (e.g., hydrogen, and fluorine compound), the air gaps 9 can be cleaned. The stable temperature of the low-dielectric layer may be 430° C. to 475° C. higher than the melting temperature of the sacrificial layer. In order to remove the melt projections from the low-dielectric layer 6. An Aurora™ low-k film (ASM Japan) has a homogeneous porosity of approximately 7% and Aurora™ 2.4 has a porosity of approximately 17%. These porosity values are enough to remove the decomposed BCB gases. As a result, the dielectric constant of the low-dielectric layer 6 is reduced.

Figure 1F:
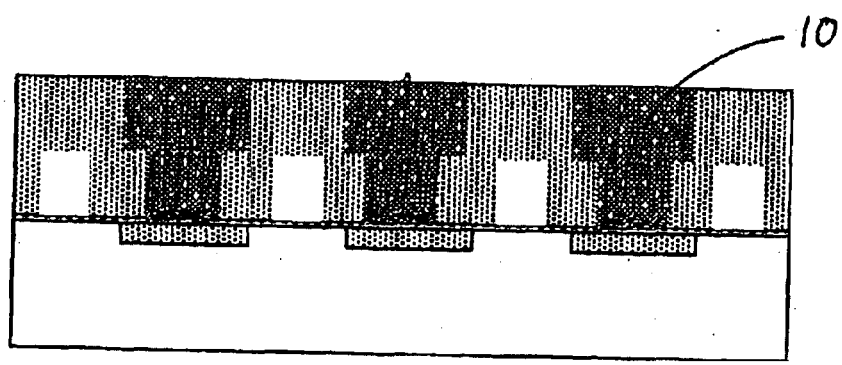

In FIG. 1(f), the vias and the trenches are filled with copper 10 for connection. Any suitable method for this step can be employed.

Figure 2A:
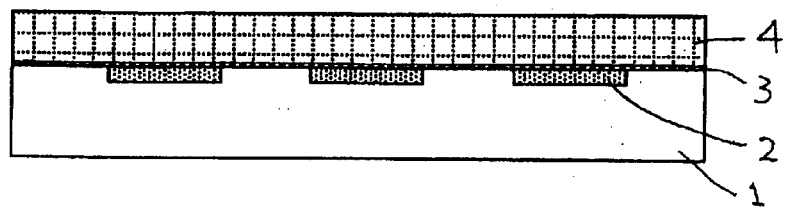
FIG. 2 (*a*) to (*f*) are cross sections of another embodiment illustrating a method for producing a porous structure with air-gaps in a semiconductor device.
Figure 2B:
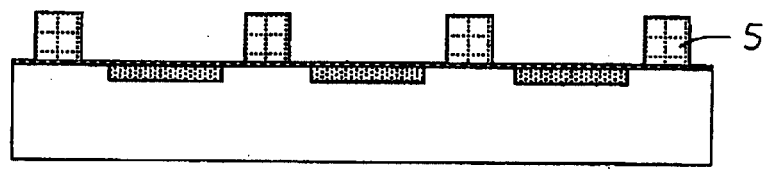
Figure 2C:
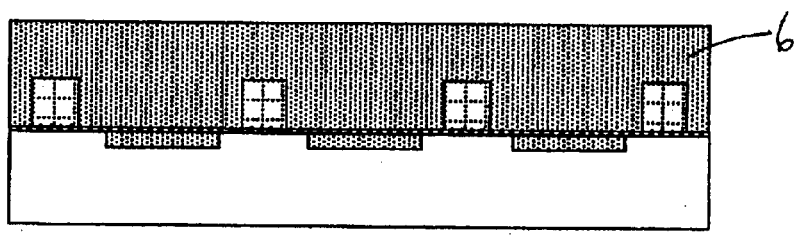
Figure 2D:
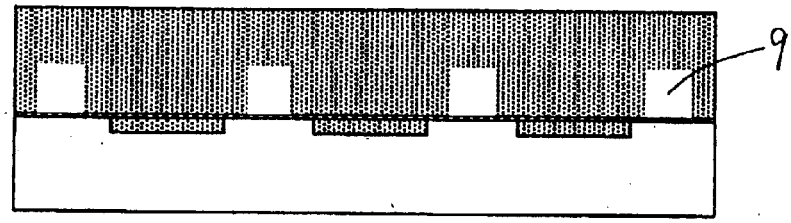
Figure 2E:
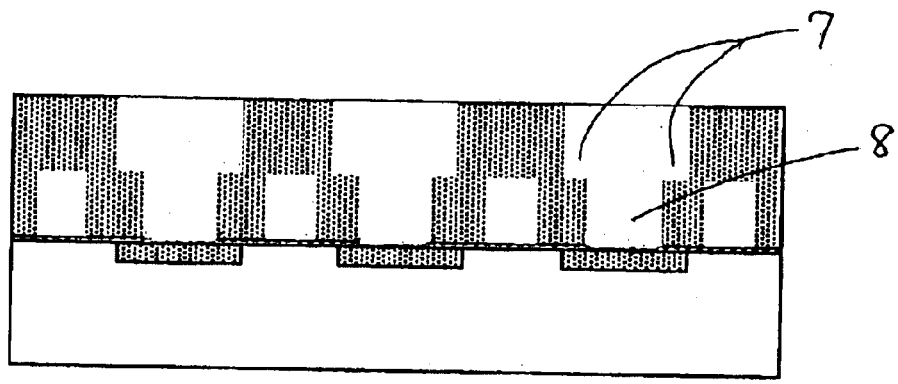
Figure 2F:
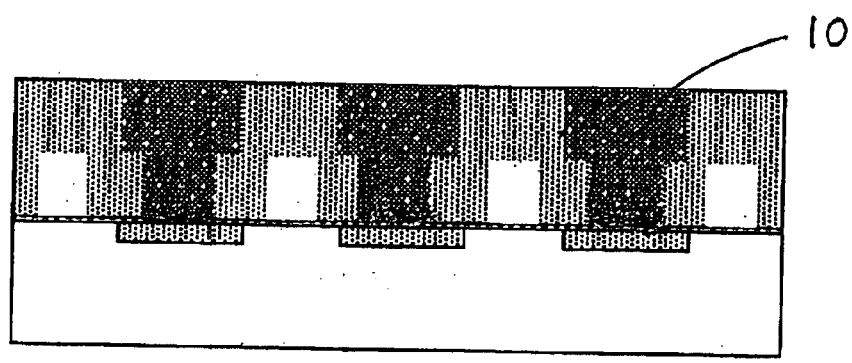

In the above, the step indicated in FIG. 1(d) and the step indicated in FIG. 1(e) can be conducted in the reversed sequence as shown in FIG. 2(a) through FIG. 2(f). The steps indicated in FIGS. 2(a), 2(b), 2(c), and 2(f) correspond to those indicated in FIGS. 1(a), 1(b), 1(c), and 1(f), respectively. The steps indicated in FIGS. 2(d) and 1(e) are reversed as in FIGS. 2(e) and 2(d).

FIGS. 3(a) through 3(g) show another embodiment. In this embodiment, a first low-dielectric layer used for forming vias is different from a second low-dielectric layer used for forming trenches. In an embodiment, the second low-dielectric layer has a lower dielectric constant than the first low-dielectric layer in order to reduce inter or intra line capacitance. In the previous embodiment shown in FIGS. 1 and 2, the air gaps are formed in the layer wherein the vias are formed, although the layer continues and deposits until the thickness of the layer is sufficient for forming the trenches. However, the air gaps can be formed in the layer wherein the trenches are formed, or through the layer, wherein the height of the air gaps is greater than the height of the vias. In the embodiment shown in FIG. 3, because the first layer wherein vias are formed is different from the second layer wherein trenches are formed, the height of the air gaps may not be greater than the height of the vias (although the height of the air gaps can be lower than the height of the vias).

Figure 3E:
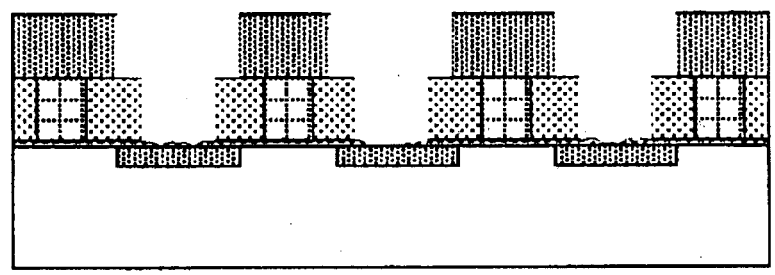
FIG. 3 (*a*) to (*g*) are cross sections of still another embodiment illustrating a method for producing a porous structure with air-gaps in a semiconductor device.
Figure 3F:
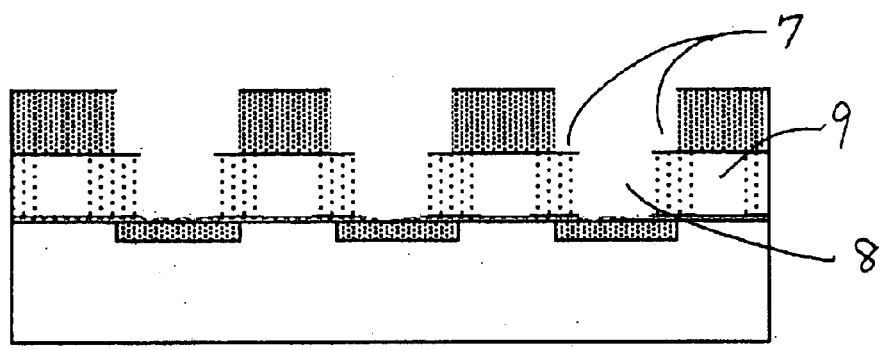
Figure 3G:
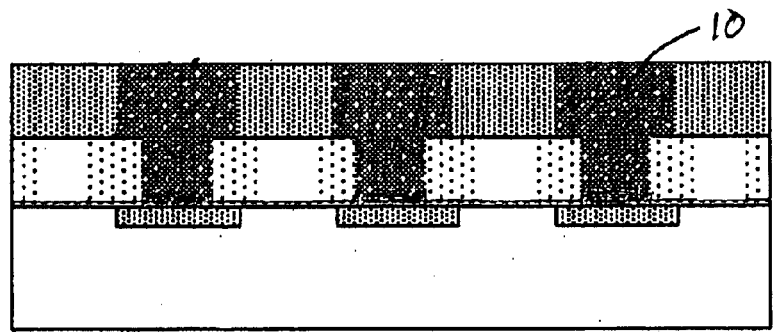

The steps indicated in FIGS. 3(a), 3(b), and 3(g) correspond to those indicated in FIGS. 1(a), 1(b), and 1(f), respectively. In FIG. 3(c), a first low-dielectric layer 20 is formed, followed by polishing or etching the top surface to level the surface. The first low-dielectric layer can be made of Aurora™ ULK (ultra low k) film and may have a dielectric constant of 2.4 to 2.7 (including a range of 2.4 to 2.6). Further, the layer may have good mechanical properties, e.g., a hardness of 1 GPa to 1.2 GPa. The first low-dielectric layer can be the same as or different from the low-dielectric layer used in FIG. 1 or 2.

In FIG. 3(d), a second low-dielectric layer 21 is deposited on top of the first low-dielectric layer 20. In this embodiment, the second low-dielectric layer 21 is different from the first low-dielectric layer, and may have a lower dielectric constant than the first low-dielectric layer as desired for devices. The stack dielectric constant after integration may be low. The second low-dielectric layer may also have lower mechanical characteristics, e.g., a hardness of 1 GPa to 2 GPa. In another embodiment, the second low-dielectric layer may have a higher dielectric constant than the first low-dielectric layer, and higher mechanical characteristics in the case where higher mechanical characteristics of the stack is required. The second low-dielectric layer can be the same as or different from the low-dielectric layer indicated in FIG. 1 or 2. The low-dielectric layers can be deposited by any suitable methods including plasma CVD (including RP-CVD and PECVD) and thermal CVD, etc. The methods disclosed in the aforesaid U.S. patents, the disclosure of which are incorporated herein by reference, can be used for this purpose.

In an embodiment, a cap film layer (made of $SiO_2$ or SiON, for example) can be formed between the first low-dielectric layer 20 and the second low-dielectric layer 21 at a thickness of 1 nm to 5 nm so that the dielectric top surface is hydrophilic for cleaning after CMP and also this layer can be used as a CMP etch stop layer.

The steps indicated in FIGS. 3(e), 3(f), and 3(g) correspond to those indicated in FIGS. 1(d), 1(e), and 1(f), respectively. The etching conditions for the first low-dielectric may be different from those for the second low-dielectric layer due to the different materials.

As with the steps indicated in FIG. 2, the sequence of steps indicated in FIGS. 3(e) and 3(f) can be reversed, wherein the removal step of the sacrificial layer is conducted prior to the via and trench etching step. This reverse sequence may be preferable in an embodiment because unwanted etching on the inner surfaces of the vias and trenches can be avoided.

The number of low-dielectric layers is not limited to two, and any desirable layers can be used. In an embodiment, the characteristics of the layer can be gradually changed from the bottom to the top.

In the above steps, the sacrificial layer and the low-dielectric layer can be deposited by a single CVD tool. For example, if the CVD tool is a cluster tool with at least three chambers, one chamber can be used for removing the sacrificial layer thermally. In order to accommodate etch stop and cap layers, the cluster tool may have an additional chamber for that purpose (i.e., total four chambers).

According to the present invention, an effective porous structure with air-gaps can effectively be formed. This process can effectively apply to interconnection layers. The various embodiments provide a number of advantages, including improved selectivity, higher process stability, reduced production costs and increased yield.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for manufacturing a semiconductor device, comprising the steps of:
   (i) depositing a sacrificial layer on a substrate having a circuit formed thereon;
   (ii) etching the sacrificial layer except for a portion where air gaps are to be formed;
   (iii) depositing a low-dielectric layer over the substrate until the portion for air gaps is entirely enclosed in the low-dielectric layer;
   (iv) etching the low-dielectric layer to form vias and trenches therethrough;
   (v) prior or subsequent to step (iv), removing the portion for air gaps of the sacrificial layer; and (vi) depositing copper in the vias and trenches which are filled with the copper contacting a surface of the substrate.

2. The method according to claim 1, wherein step (v) is conducted after step (iv).

3. The method according to claim 1, wherein step (iii) comprises:
    depositing a first low-dielectric layer over the substrate until the first low-dielectric layer and the portion for air gaps are of equal height; and
    depositing a second low-dielectric layer on the first low-dielectric layer and the portion for air gaps.

4. The method according to claim 3, further comprising deposing an etch stop layer between the first low-dielectric layer and the second low-dielectric layer.

5. The method according to claim 1, wherein the substrate further includes a cap layer on which the sacrificial layer deposits, wherein step (ii) further includes etching the cap layer.

6. The method according to claim 5, wherein the substrate further includes a wiring layer underneath the cap layer, wherein the wiring layer is connected to the copper.

7. The method according to claim 1, wherein the sacrificial layer is made of an organic polymer.

8. The method according to claim 7, wherein the organic polymer is benzocyclobutene (BCB).

9. The method according to claim 1, wherein step (v) is selective etching based on etching temperature.

10. The method according to claim 9, wherein the etching temperature is 400° C. or lower.

11. The method according to claim 3, wherein the first low-dielectric layer has a dielectric constant of 3.0 or less.

12. The method according to claim 11, wherein the first low-dielectric layer has compressive stress.

13. The method according to claim 3, wherein the first low-dielectric layer is deposited by a combination of dimethyldimethoxysilane (DMDMOS) with divinyldimethylsilane (DVDMS) or oxygen-containg molecules.

14. The method according to claim 3, wherein the second low-dielectric layer has a dielectric constant of 2.6 or less.

15. The method according to claim 14, wherein the second low-dielectric layer has compressive stress.

16. The method according to claim 3, wherein the second low-dielectric layer is deposited by a combination of dimethyldimethoxysilane (DMDMOS) with divinyldimethylsilane (DVDMS) or oxygen-containg molecules.

17. The method according to claim 1, wherein the portion of air gaps in the low-dielectric layer is formed to give a porosity of 6% to 25%.

18. The method according to claim 1, wherein the height of the portion for air gaps is in the range of 1 nm to 100 nm.

19. The method according to claim 1, wherein the low-dielectric layer including the air gaps has a dielectric constant of 2.3 or less.

20. The method according to claim 1, which is conducted using a plasma CVD chamber.

21. The method according to claim 1, wherein the vias and the air gaps are substantially of equal height.

* * * * *